(12) United States Patent
Chen

(10) Patent No.: US 8,344,347 B2
(45) Date of Patent: Jan. 1, 2013

(54) MULTI-LAYER ELECTRODE STRUCTURE

(75) Inventor: Shih-Hung Chen, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 167 days.

(21) Appl. No.: 11/611,428

(22) Filed: Dec. 15, 2006

(65) Prior Publication Data
US 2008/0142984 A1    Jun. 19, 2008

(51) Int. Cl.
*H01L 47/00* (2006.01)
(52) U.S. Cl. .................. 257/4; 257/5; 257/249
(58) Field of Classification Search .................. 257/532, 257/774, 2, 4, 5, 249; 438/95, 102
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,515,488 A | 5/1996 | Stephens, Jr. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,825,046 A * | 10/1998 | Czubatyj et al. .................. 257/2 |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |

(Continued)

FOREIGN PATENT DOCUMENTS

WO    WO 00/45108 A1    8/2000
(Continued)

OTHER PUBLICATIONS

Adler, David, "Amorphous-Semiconductor Devices," Sci. Amer., vol. 236, pp. 36-48, May 1977.

(Continued)

*Primary Examiner* — Howard Weiss
*Assistant Examiner* — Tifney Skyles
(74) *Attorney, Agent, or Firm* — Haynes Beffel & Wolfeld LLP

(57) ABSTRACT

An electrode structure including two parallel electrical paths. A plurality of electrode layers, generally tabular in form is formed in a stack, the outermost layers providing electrical contacts, and defining a first electrical current path through the stack. Two sidewall conductor layers are formed to abut either end of the electrode layer stack, two sidewall conductor layers defining a second electrical current path. The ends of the sidewall conduction layers lie in the same planes as the electrode layer electrical contacts, such that electrode structure electrical contacts are each formed from one set of sidewall layer ends and an electrode layer electrical contact.

21 Claims, 12 Drawing Sheets

U.S. PATENT DOCUMENTS

| | | | |
|---|---|---|---|
| 5,985,698 A | 11/1999 | Gonzalez et al. | |
| 5,998,244 A | 12/1999 | Wolstenholme et al. | |
| 5,998,250 A * | 12/1999 | Andricacos et al. | 438/240 |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,635,951 B1 * | 10/2003 | Zahorik | 257/613 |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,830,952 B2 | 12/2004 | Lung et al. | |
| 6,849,891 B1 * | 2/2005 | Hsu et al. | 257/296 |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen | |
| 7,023,009 B2 | 4/2006 | Kostylev et al. | |
| 7,033,856 B2 | 4/2006 | Lung et al. | |
| 7,042,001 B2 | 5/2006 | Kim et al. | |
| 7,049,153 B2 * | 5/2006 | Agarwal et al. | 438/3 |
| 7,067,865 B2 | 6/2006 | Lung et al. | |
| 7,115,927 B2 * | 10/2006 | Hideki et al. | 257/296 |
| 7,126,149 B2 | 10/2006 | Iwasaki et al. | |
| 7,132,675 B2 | 11/2006 | Gilton | |
| 7,166,533 B2 | 1/2007 | Happ | |
| 7,214,958 B2 | 5/2007 | Happ | |
| 7,220,983 B2 | 5/2007 | Lung | |
| 2004/0051094 A1 | 3/2004 | Ooishi | |
| 2004/0171216 A1 * | 9/2004 | Ohmi et al. | 438/257 |
| 2004/0248339 A1 | 12/2004 | Lung | |
| 2005/0029502 A1 | 2/2005 | Hudgens | |
| 2005/0029587 A1 | 2/2005 | Harshfield | |
| 2005/0093022 A1 | 5/2005 | Lung | |
| 2005/0146955 A1 * | 7/2005 | Kajiyama | 365/202 |
| 2005/0167656 A1 | 8/2005 | Sun et al. | |
| 2005/0201182 A1 | 9/2005 | Osada et al. | |
| 2005/0212024 A1 | 9/2005 | Happ | |
| 2005/0215009 A1 | 9/2005 | Cho | |
| 2005/0230725 A1 * | 10/2005 | Aggarwal et al. | 257/295 |
| 2005/0270832 A1 | 12/2005 | Chu et al. | |
| 2006/0006472 A1 | 1/2006 | Jiang | |
| 2006/0081961 A1 | 4/2006 | Tanaka et al. | |
| 2006/0108667 A1 | 5/2006 | Lung | |
| 2006/0110878 A1 | 5/2006 | Lung et al. | |
| 2006/0118913 A1 | 6/2006 | Yi et al. | |
| 2006/0175599 A1 | 8/2006 | Happ | |
| 2006/0226409 A1 | 10/2006 | Burr et al. | |
| 2006/0234138 A1 | 10/2006 | Fehlhaber et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2007/0030721 A1 | 2/2007 | Segal et al. | |
| 2007/0037101 A1 | 2/2007 | Morioka | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0257300 A1 | 11/2007 | Ho et al. | |
| 2009/0166600 A1 | 7/2009 | Park et al. | |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24µm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

M. Quirk and J. Serda, "Semiconductor Manufacturing Technology," PrenticeHall, 2001, pp. 216-217.

* cited by examiner

MULTI-LAYER ELECTRODE STRUCTURE

PARTIES TO A JOINT RESEARCH AGREEMENT

International Business Machines Corporation, a New York corporation; Macronix International Corporation, Ltd., a Taiwan corporation; and Infineon Technologies AG, a German corporation, are parties to a Joint Research Agreement.

BACKGROUND OF THE INVENTION

1. Field of the Invention

The present invention relates generally to the field of integrated circuit design and more particularly to the field of the design and fabrication of memory devices.

2. Description of Related Art

Non-volatile memory applications have gained in popularity as the technology has made smaller, reliable units available for storing mass quantities of data. Large external data storage devices gave way to specialized mass storage drives, which in turn have yielded to so-called "memory sticks" and miniature cards, all capable of storing gigabytes of data.

At these storage levels, power consumption becomes important. With literally billions of elements, power consumption for each memory storage element must be held to a very low level. The goal of absolute minimization of power usage is critical to the function and capacity of such devices.

An important technology in this field is the various forms of Resistance Random Access Memory (RRAM), described in more detail below. U.S. patent application Ser. No. 11/155,067, entitled "Thin Film Fuse Phase Change Ram And Manufacturing Method" and commonly owned by the assignee hereof, discusses such technology in detail and is hereby incorporated herein for all purposes.

As shown therein, an important process in the operation of memory elements incorporating such technology is heating interior element rapidly and efficiently. Various methods have been proposed to assist that process, many of which focus on preventing heat loss within the memory element.

Obtaining optimum utilization of the power consumption itself has not heretofore been a key aspect of investigation. Memory elements to date have featured conventional means for coupling electrical current to the memory element itself. The art is thus silent on making increased use of such sources for assisting in the heat production of the memory element.

SUMMARY OF THE INVENTION

An aspect of the invention is an electrode structure including two parallel electrical paths. A plurality of electrode layers, generally tabular in form is formed in a stack, the outermost layers providing electrical contacts, and defining a first electrical current path through the stack. Two sidewall conductor layers are formed to abut either end of the electrode layer stack, two sidewall conductor layers defining a second electrical current path. The ends of the sidewall conduction layers lie in the same planes as the electrode layer electrical contacts, such that electrode structure electrical contacts are each formed from one set of sidewall layer ends and an electrode layer electrical contact.

DETAILED DESCRIPTION

Figure 1A:
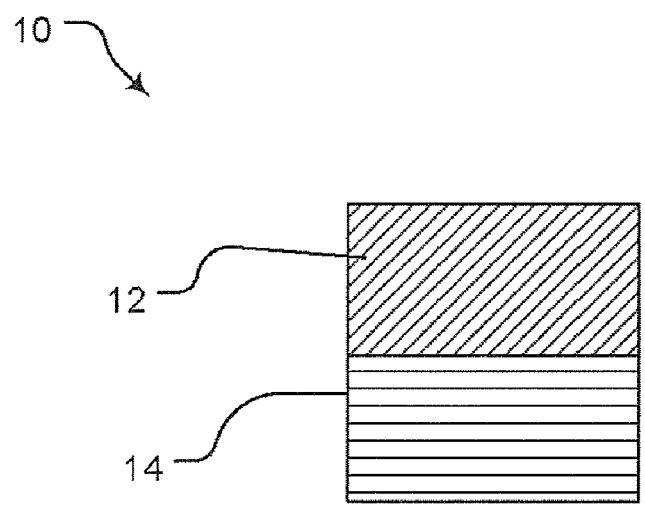
FIGS. 1a-1c depict an embodiment of the invention claimed herein and variations on that embodiment.

A detailed description of an electrode structure that provides enhanced thermal properties is provided here, to enable a person of ordinary skill in the art to practice the invention. Embodiments are illustrated in the drawings, as also will be discussed. Those in the art will understand that a number of alternative approaches will be presented, and other approaches will be known by those in the art. The invention itself is defined solely by the claims, as further discussed below.

FIG. 1a depicts a basic embodiment 10 of an electrode structure. As shown the electrode is generally tabular in form, with contact areas suitable for establishing electrical contact with circuit elements. The electrode includes two layers, a bottom layer 14 and a top layer 12. It will be understood that the words "bottom" and "top" as used here are employed for convenience of labeling and do not imply any functional importance. The device as shown could be oriented on its side (i.e., rotated 90 degrees from the illustrated position) or flipped over (i.e., rotated 180 degrees) with no change in function.

It has been found that constructing an electrode of multiple layers results in reduced heat transfer across the device. This is true whether the layers are formed of different materials or the same material, so that multiple layers result in a lower thermal conductivity than would be exhibited by an equally thick single layer of the same material. Moreover, this phenomenon also gives a designer high flexibility in creating a design that provides exactly the set of characteristics that are required for a particular situation. Here, it is preferred to form the electrode layers of materials chosen to provide suitable thermal and electrical conductivity and resistance. Preferred materials include TiN, TaN, or Ta. It should be noted that a design criterion here is to produce some non-perfect interface that exhibits high resistance and low thermal conductivity. Thus, materials such as TiN, which has good barrier characteristics, are preferred, while Ti, being more active and thus likely to bind with neighboring materials, is not. TiN can be deposited using Chemical Vapor Deposition (CVD) techniques, and all materials can be deposited by Physical Vapor Deposition (PVD), all as known in the art. It is preferred that the layers be deposited from about 0.3 nm to about 20 nm in thickness, most preferably about 5 nm. Thin films have been found to produce the most effective interfaces in the embodiments described.

The result of the structure shown in FIG. 1a is an electrode construction that provides the specified electrical current and voltage, but it does not conduct heat as rapidly as does the typical prior art device. The importance of the characteristic is discussed below.

As depicted in FIG. 1a, two layers of different material are shown. In fact, the number of layers can be varied as desired.

The designer can choose a number of layers based on factors such as the total electrical resistance and thermal conductivity desired, the cost or time involved with multiple deposition processes, and other considerations familiar to those in the art. Hereafter, the multi-layer devices will be shown with two layers, but readers will understand that any number of layers are implied by that structure.

Figure 1B:
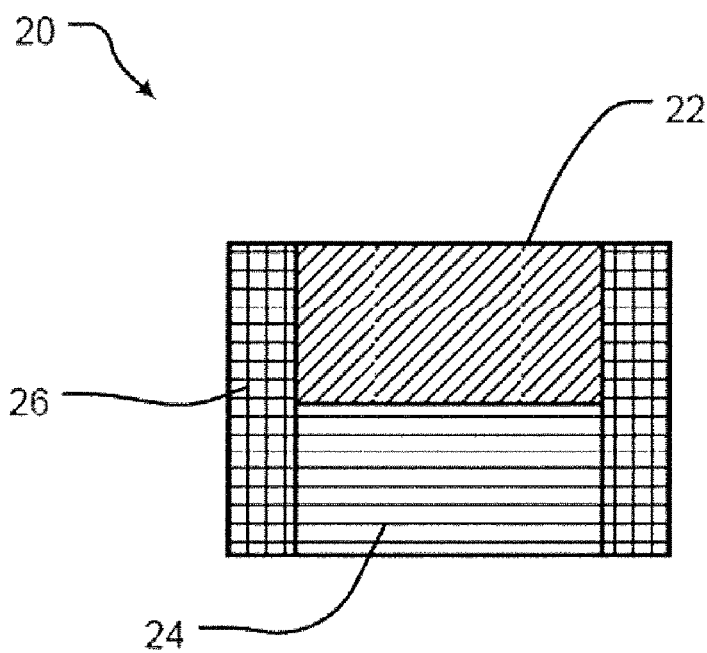

Additional control over the electrical and thermal properties of an electrode structure 20 is obtained by adding sidewall conductors 26, as seen in FIG. 1*b*. There, the top and bottom layers 22 and 24 correspond to the similarly-named layers shown in FIG. 1, and sidewall conductors 26 spanning both of those layers have been added. Material for the sidewall conductors is Ti in the embodiment shown. The sidewall conductors 26 are positioned so that their ends lie in the same plane as the conductive elements, so that each sidewall conductor offers a current path extending from one electrode to the other, with no material or element transitions in between. It is preferred that the sidewalls be deposited from about 0.3 nm to about 20 in thickness, most preferably about 5 nm.

It should be borne in mind that a design may include side conductors or not, as best suits a given application. In the discussion that follows, sidewall conductors are generally shown as being included, but those in the art will understand that such elements are not an essential or necessary part of the invention claimed herein.

Figure 1C:
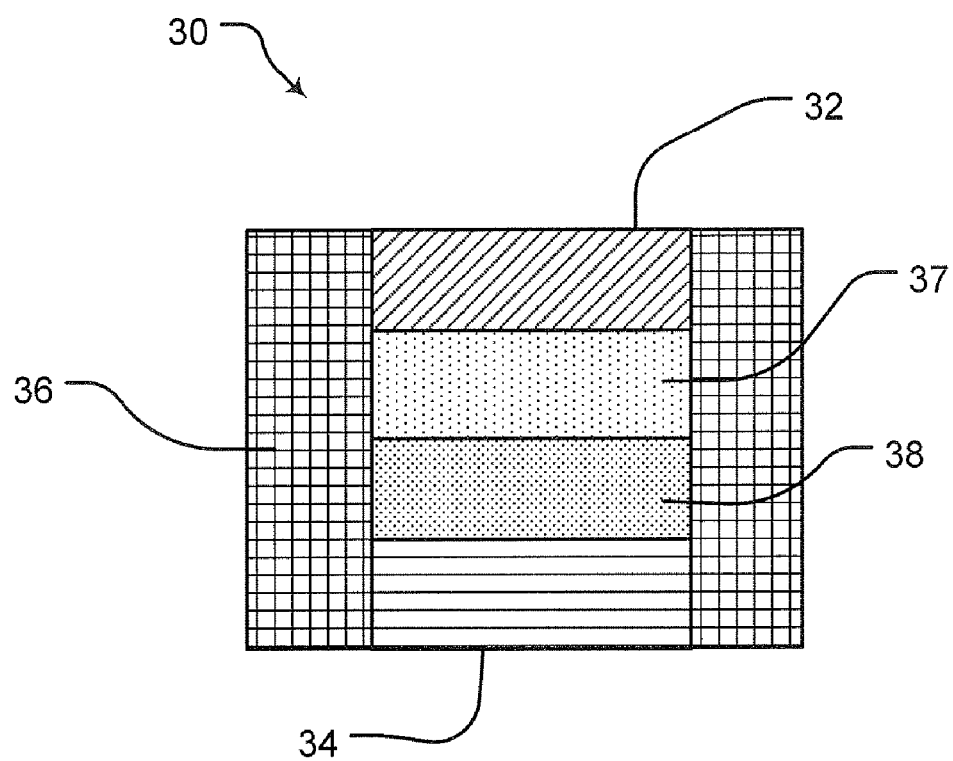

A further alternative is the addition of thin layers of conductor material to the structure. As shown in FIG. 1*c*, one may construct an electrode 30, including not only top and bottom electric elements 32 and 34, and sidewall conductors 36, but also additional conductor layers 37 and 38. These layers are composed of materials associated with metallizing layers. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. As noted above, material stability is an important design criterion. Thus, most embodiments employ Ta/TaN/TiN/TaSiN. In one embodiment, these characteristics are enhanced by high doping levels of the material.

Figure 1D:
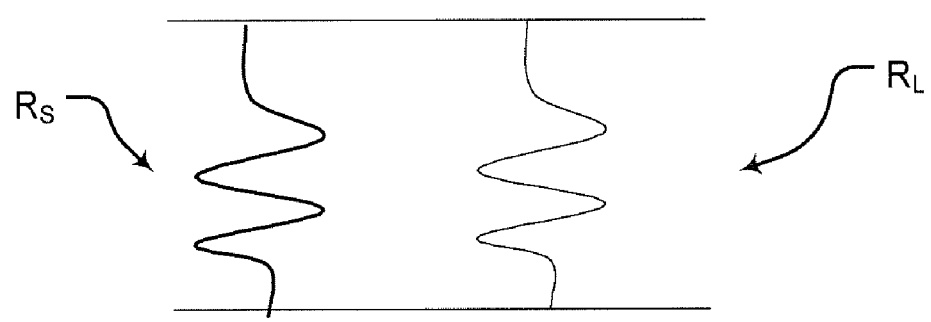
FIG. 1d illustrates schematically the operation of the embodiments of FIGS. 1b and 1c.

The stabilizing effect of the sidewall conductors can be visualized by reference to FIGS. 1*c* and 1*d*. The stacked layer elements in the central portion of FIG. 1*c*. (layers 32, 34, 37 and 38 in FIG. 1*c*) are clearly arranged in a series connection, so that each element added directly to the total resistance. Thus, $$RL=R32+R34+R37+R38 \qquad \text{(Eq. 1)}$$

where RL is the resistance of the central portion of the electrode, with the subscripted values being the individual resistance of each layer. The sidewall conductors, however, are arranged in parallel to the layered elements, producing the equivalent circuit shown in FIG. 1*d*, with the layered elements producing a resistance RL and the sidewall conductors a resistance RS. As the arrangement here is a parallel circuit, the resistance calculation is $$RE=(RL)(RS)$$

$$RL+RS \qquad \text{(Eq. 2)}$$

$$RE=(RL)(RS)/(RL+RS) \qquad \text{Eq2}$$

As can be seen, the addition of a parallel element has an immediate stabilizing effect, in that the addition of additional elements reduces the resistance depending on the existing values. Again, these changes result in greater design flexibility for the circuit analyst.

Figure 2A:
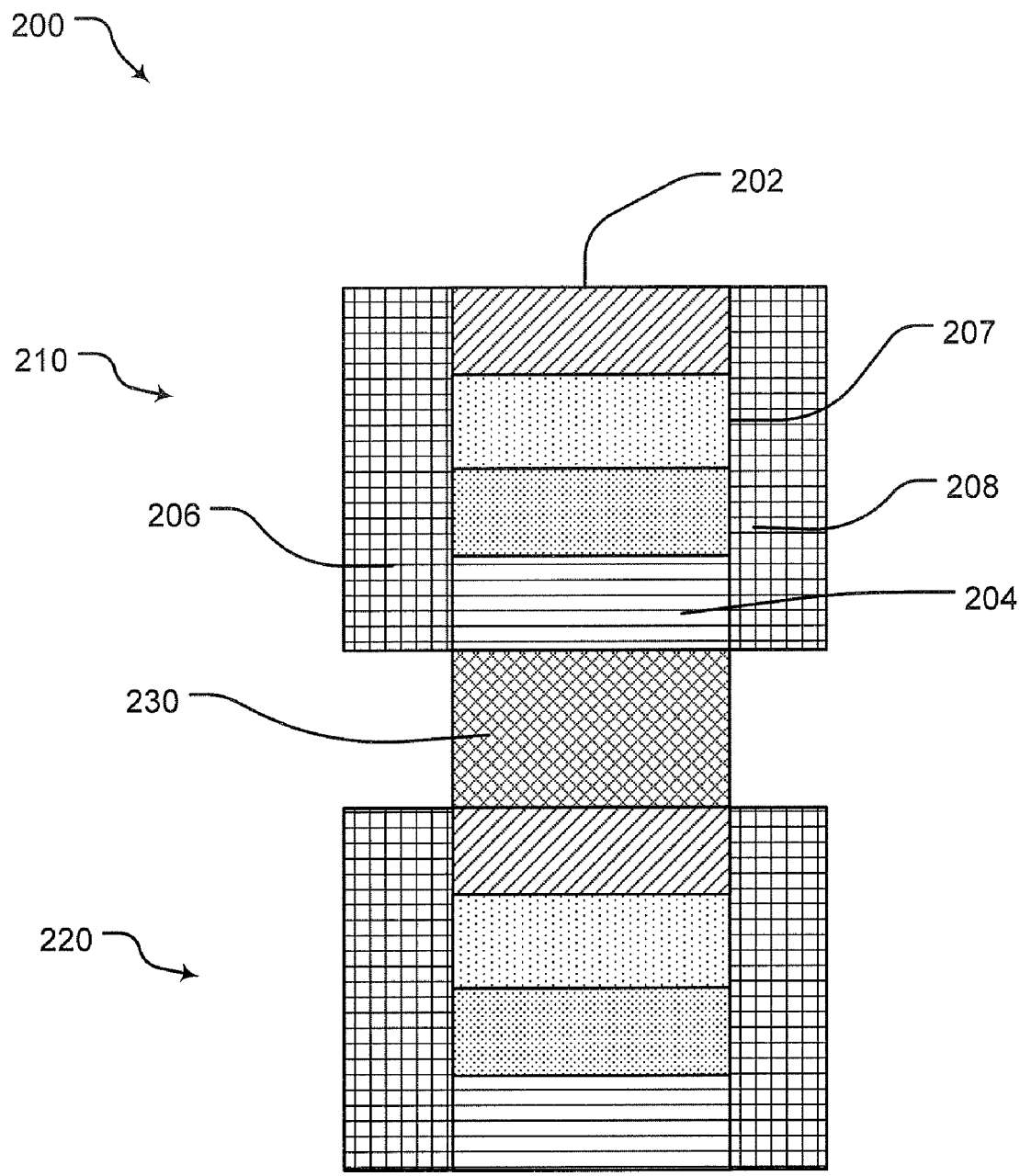
FIGS. 2a and 2b depict an embodiment of a memory element including an embodiment of the invention claimed herein.

An application of the embodiment of FIG. 1*c* is seen in the memory cell 200 shown in FIG. 2*a*, generally comprising an upper electrode 210, a lower electrode 220 and a memory element 230 lying between and in contact with the electrodes. the electrodes are constructed identically, and thus only upper electrode 210 is labeled. As previously discussed, the elements of the electrodes are top and bottom electrode elements 202 and 204, two conductor layers 207 and 208, and sidewall conductors 206.

Between the electrodes lies a memory element 230, fabricated from a resistance random access memory (RRAM) material. Several materials have proved useful in fabricating RRAM, as described below.

An important class of RRAM material is the chalcogenide group. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Because chalcogenides achieve their dual-memory capabilities by forming two solid phases, each of which exhibits a characteristic resistance, these materials are referred to as "phase change" materials or alloys.

Many phase change based memory materials have been described in technical literature, including alloys of: Ge/Sb, Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include Ge2Sb2Te5, GeSb2Te4 and GeSb4Te7. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention. One such material is a colossal magneto resistance (CMR) material, which dramatically change resistance levels in the presence of a magnetic field. Such materials are generally manganese-based perovskite oxides, and the resistance changes encountered are generally in the range of orders of magnitude. A preferred formulation for RRAM applications is $Pr_xCa_yMnO_3$, where x:y=0.5:0.5, or other compositions in which x:0~1; y:0~1. Other CMR materials including an Mn oxide can also be employed.

Another RRAM material is a 2-element compound, such as $Ni_xO_y$; $Ti_xO_y$; $Al_xO_y$; $W_xO_y$; $Zn_xO_y$; $Zr_xO_y$; $Cu_xO_y$, where x:y=0.5:0.5. Alternatively, another compound in this group could be employed, in which x: 0~1; y: 0~1. Also, polymers employing dopants such as Cu, $C_{60}$, Ag can be employed, including 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

As previously noted, the electrode elements of FIG. 2a provide the desired levels of electrical voltage and current, but they do not conduct heat away from the RRAM element 230 as rapidly as is seen in the prior art. The RRAM element thus retains a higher proportion of the heat generated by current flow, which reduces the electrical input required to produce a given heat level in the RRAM, which in turn facilitates the changes of state associated with these devices.

Figure 2B:
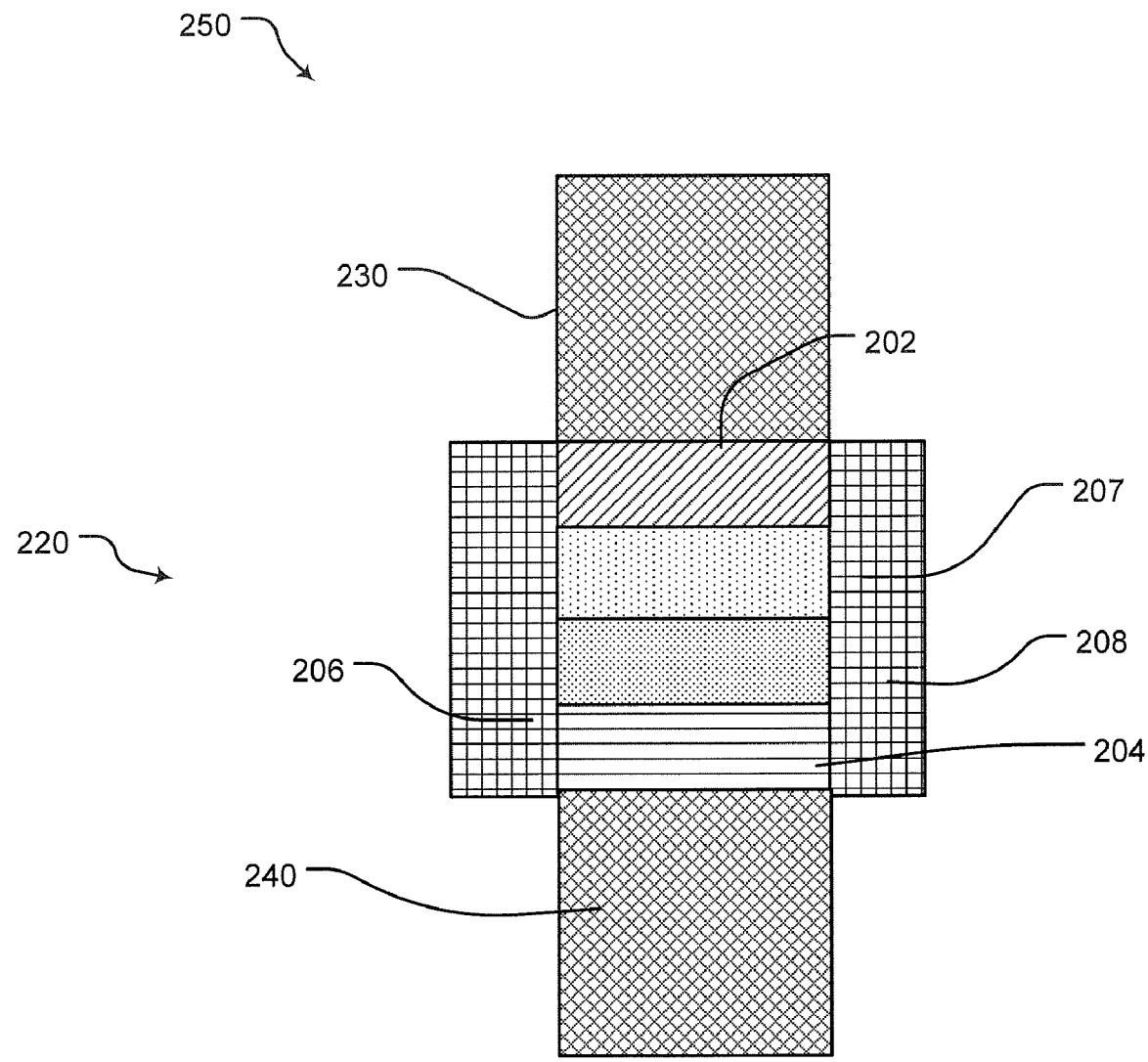

FIG. 2b illustrates a further alternative embodiment 250, in which the higher resistivity of a multi-layer element 220, and the concomitant increase in heat generation, is harnessed to provide heat to two RRAM devices, 230 and 240. Apart from that change, the sub-elements and composition of the parts are identical to those discussed above.

Figure 3A:
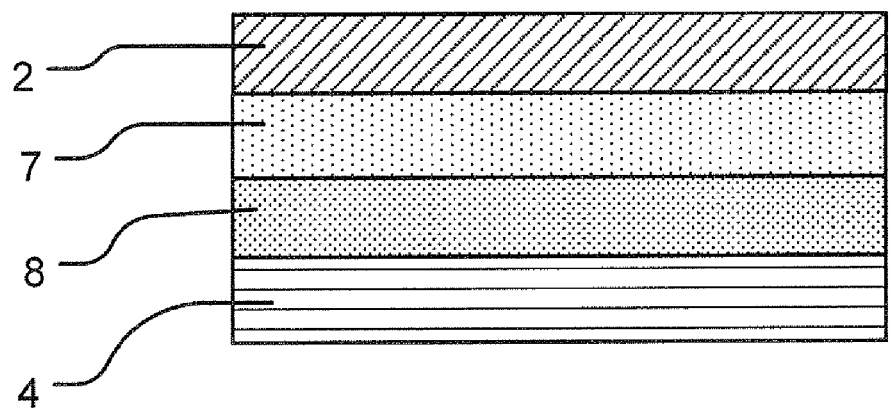
FIGS. 3a-3e depict an embodiment of a process for producing an embodiment of the invention claimed herein.

An embodiment of a process for fabricating an electrode element as described above is shown in FIGS. 3a-3e. The process starts, in FIG. 3a, with the deposition of layers on a substrate, of the top and bottom electrode material 2 and 4, as well as the conductive material layers 7 and 8. Here it should be borne in mind that the designer is free to choose both the specific material and the number of layers to employ here, ranging from a minimal structure of only the top and bottom electrode layers, ranging to multi-level conductive material layers, both with and without sidewall conductors. For exemplary purposes only, the process shown here builds a structure having two conductive material layers, the top and bottom electrodes, and one set of sidewall conductors.

The deposition can be accomplished using conventional techniques known in the art, preferably CVD and PVD processes. The specific processes are largely dictated by the nature of the chosen materials, as is known in the art.

Figure 3B:
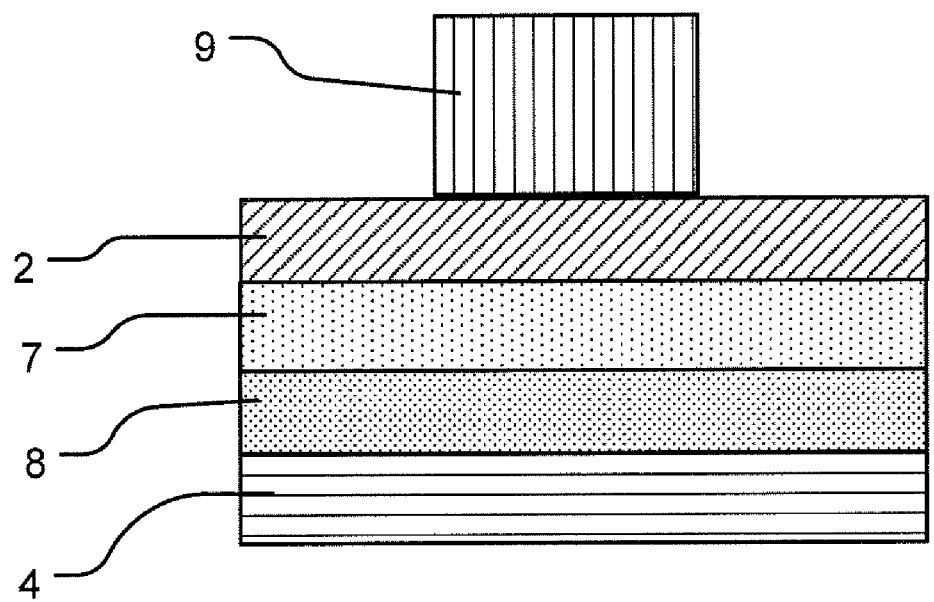
Figure 3C:
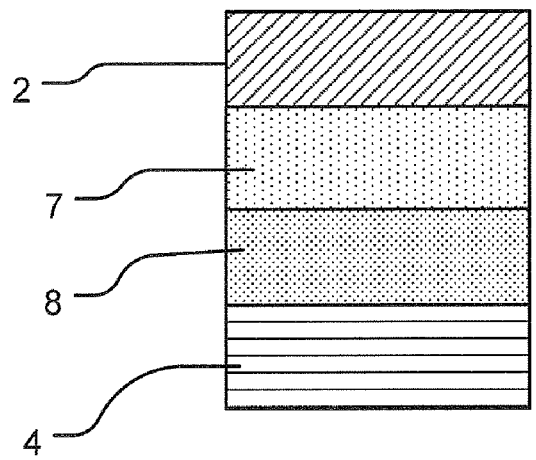

Following the initial deposition, the process proceeds to establish the dimensions of the layer stack, in FIG. 3b, starting with deposition of a mask 9, positioned and dimensioned to result in a stack having the desired lateral dimensions. This process employs conventional photolithography practices, to produce the stack 1 shown in FIG. 3c.

Figure 3D:
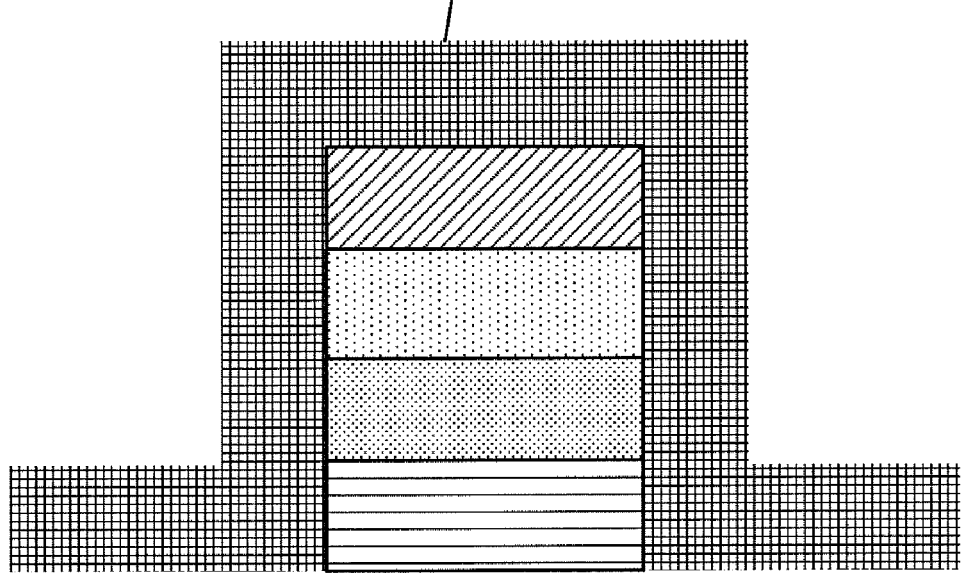
Figure 3E:
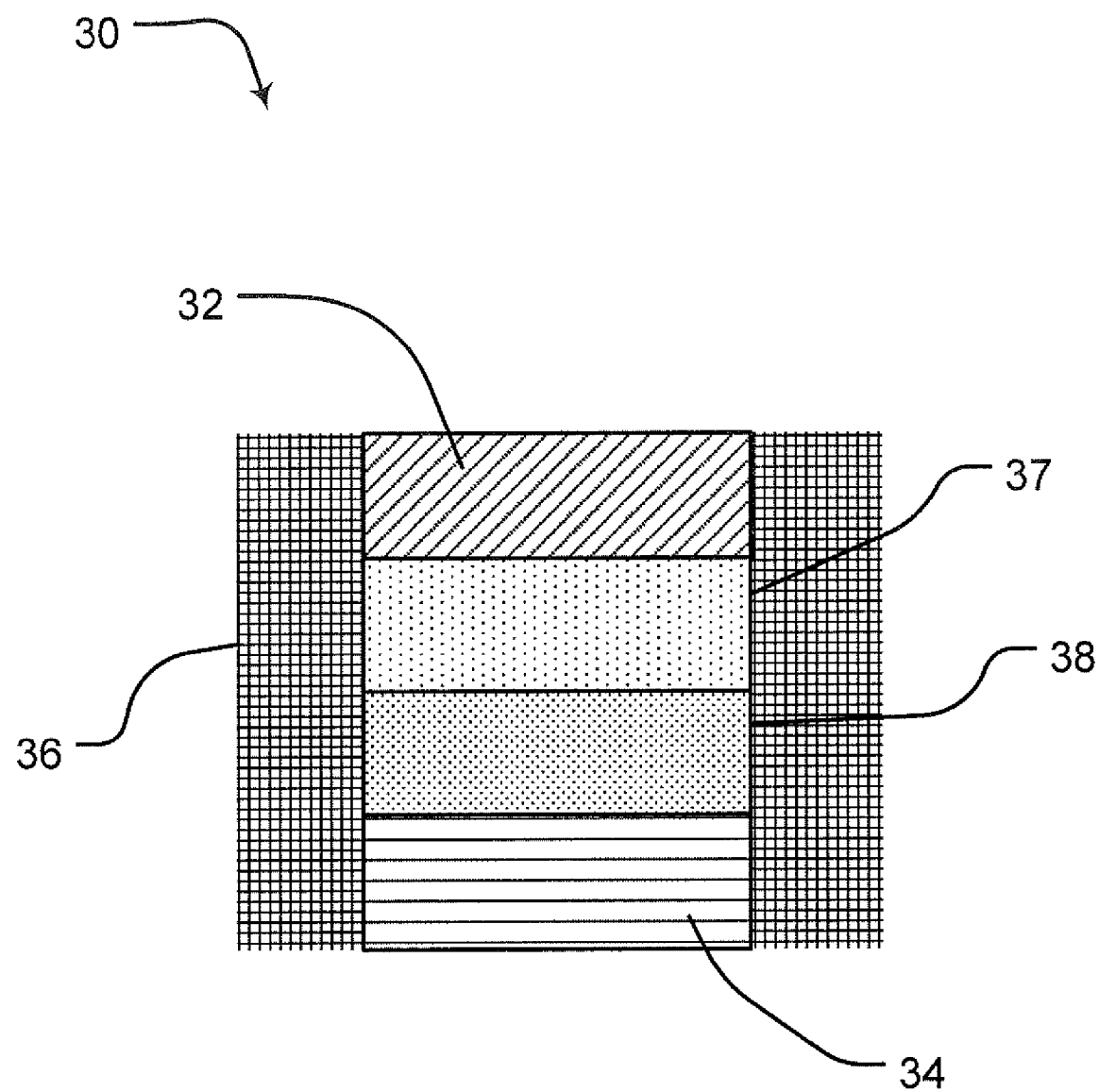

The side conductors are added in several steps. First, as seen in FIG. 3d, a layer of sidewall conductor material 6 is deposited, producing a layer that covers the entire stack and the surrounding area. As will previous depositions, this process is best accomplished using conventional techniques.

Excess material is removed by employing an anisotropic etch to remove material extending laterally from the stack and at least partially from the top, and then a Chemical Mechanical Polish (CMP) process is applied to planarize the upper surface of the completed electrode element, producing the electrode 30, previously seen in FIG. 1c. The planarization must be controlled to expose the upper surface of top electrode 32, as well as to ensure that both side conductors 36 and the top electrode lie in the same plane.

Figure 4A:
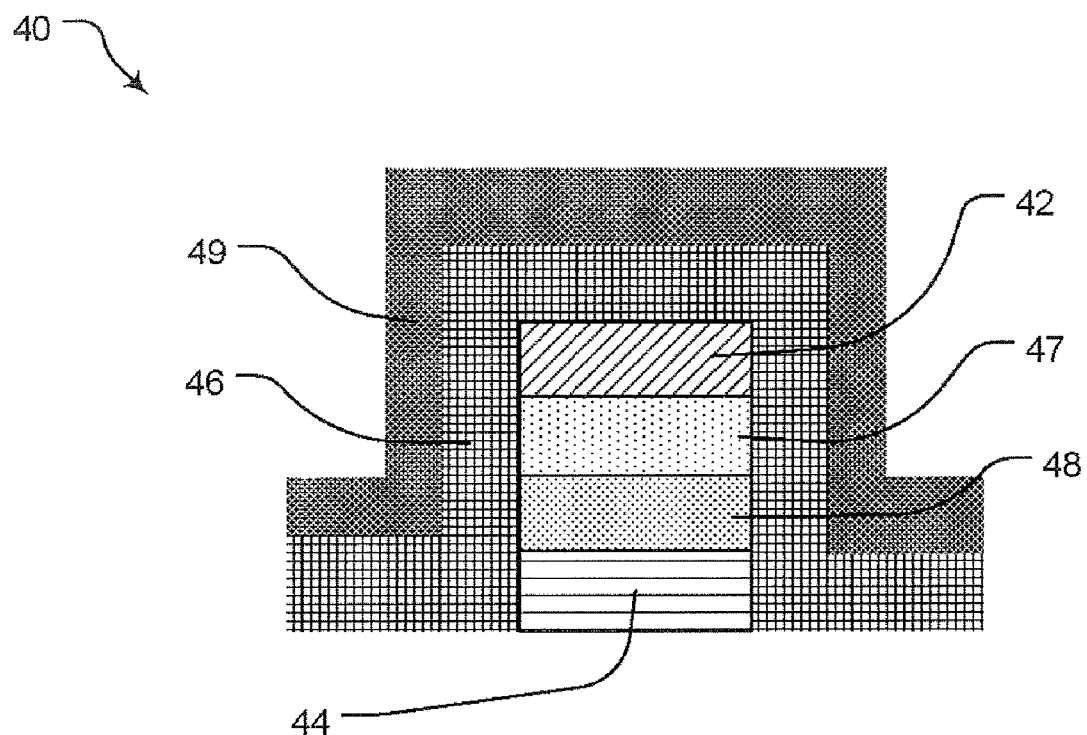
FIGS. 4a and 4b depict an embodiment of a process for producing a further embodiment of the invention claimed herein.
Figure 4B:
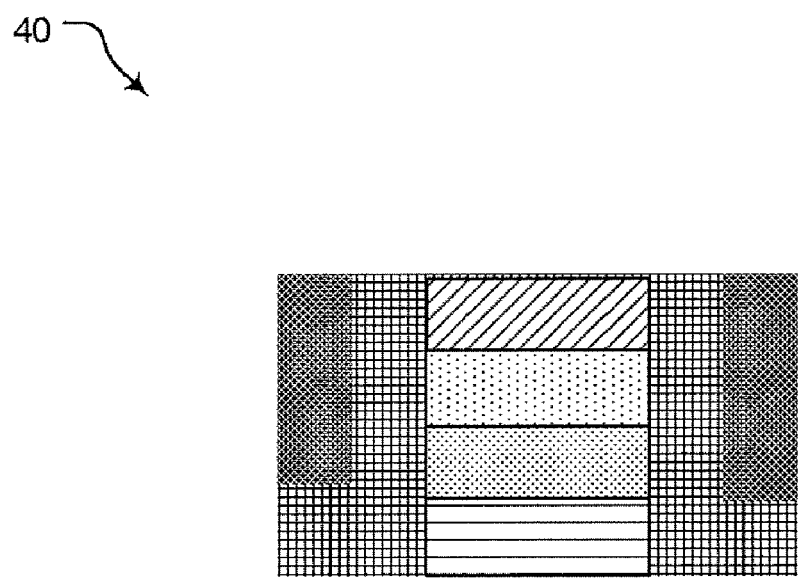

A further variant embodiment 40 is shown in FIGS. 4a and 4b. There, it is desired to add a dielectric layer 49 over the sidewall conductor 46. As shown in FIG. 4a, this process takes up following deposition of the sidewall conductor material (FIG. 3d), which step is followed by deposition of a dielectric layer 49. The dielectric material preferably comprises silicon dioxide, a polyimide, silicon nitride or other dielectric fill materials known in the art.

There follows a conventional anisotropic etch step to define the lateral dimension of the structure, and a planarization step, employing CMP, the results of which are shown in FIG. 4b.

Figure 5A:
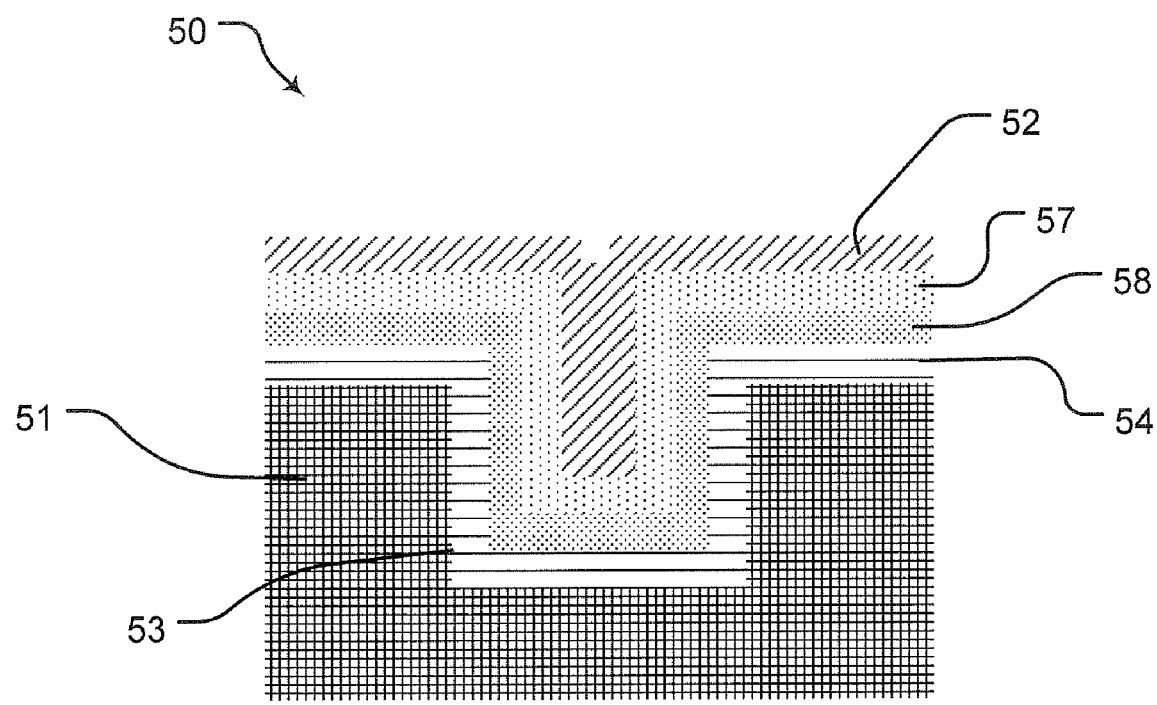
FIGS. 5a and 5b depict an embodiment of a process for producing another embodiment of the invention claimed herein.
Figure 5B:
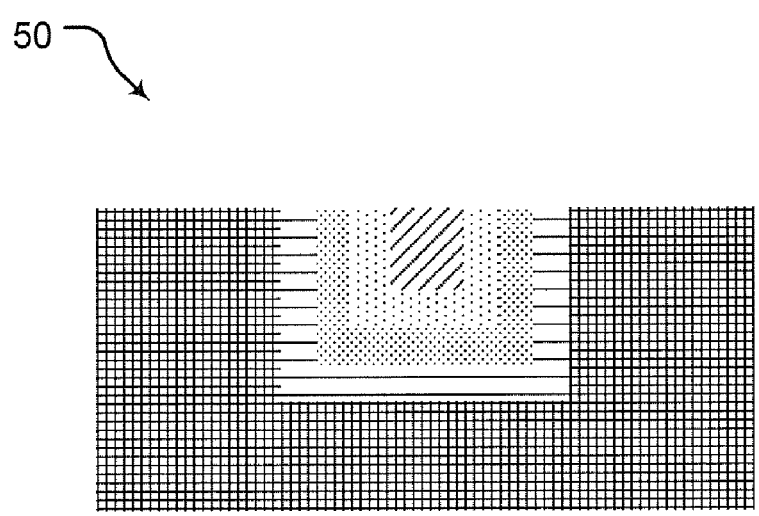

The various embodiments described above are all fabricated in what might be best described as a "build-up" process. An alternative approach, based on the same principles, is shown in FIGS. 5a and 5b. There, an electrode element 50 is produced by a creating and filling a recess in a substrate. As shown, a substrate 51 is provided, as is normally done in chip fabrication, and a recess or depression 51 is formed in the same. Next, a succession of deposition steps, identical to those discussed above, is undertaken to deposit top and bottom electrode layers 52 and 54 and conductive material layers 57 and 58. These layers fill the recess 53 as shown, creating a "layer cake" effect. The resulting structure is planarized to remove the layered material extending beyond the recess 53, as seen in FIG. 5b.

The process of forming such an electrode structure is seen in greater detail in FIGS. 6a-6d. Here, the electrode structure 60 consists of a substrate 61, as discussed, having a plug 65 formed therein, seen in FIG. 6a. The plug functions as an electrical contact, preferably formed from a refractory metal such as tungsten, formed in the substrate by conventional means. Other refractory metals include Ti, Mo, Al, Ta, Cu, Pt, Ir, La, Ni, and Ru and oxides of the same.

Figure 6A:
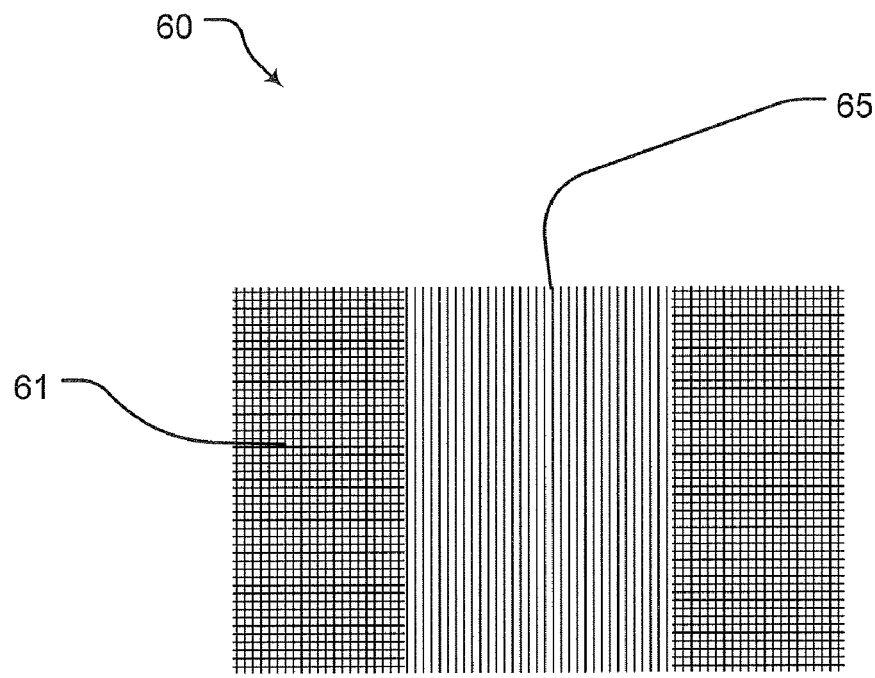
FIGS. 6a-6e depict an embodiment of a further process for producing an embodiment of the invention claimed herein.
Figure 6B:
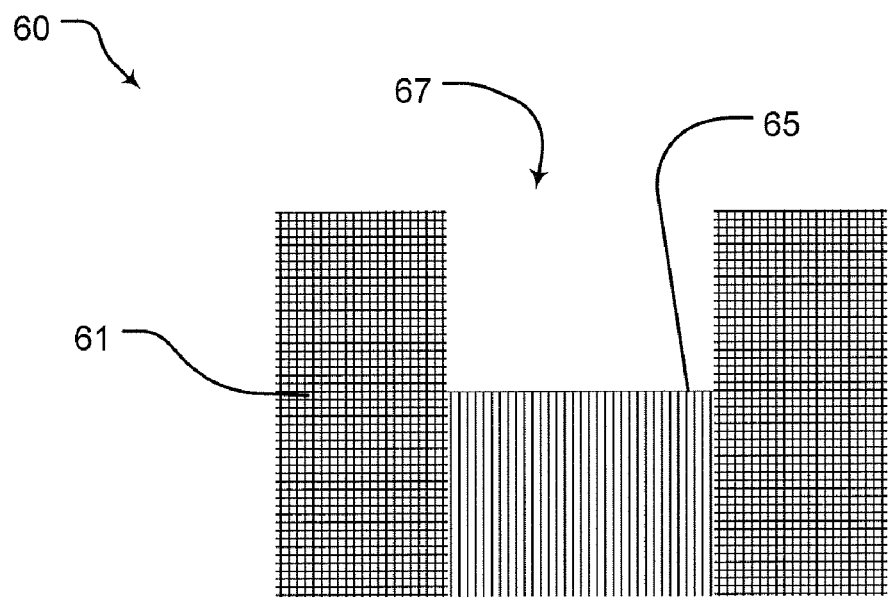
Figure 6C:
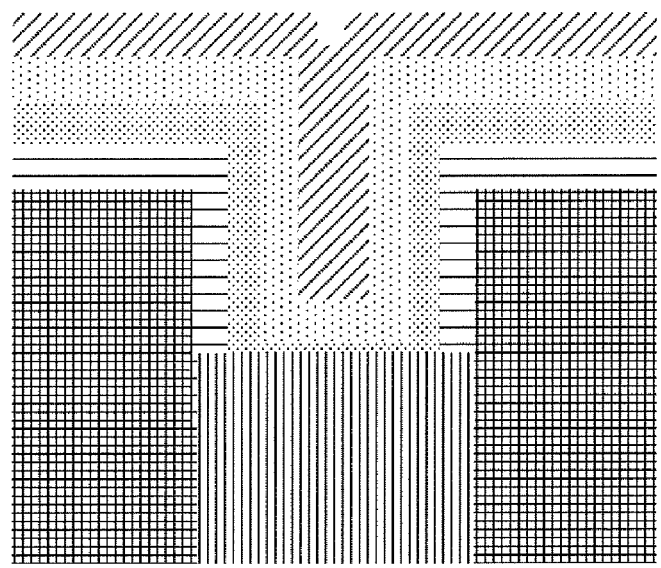
Figure 6D:
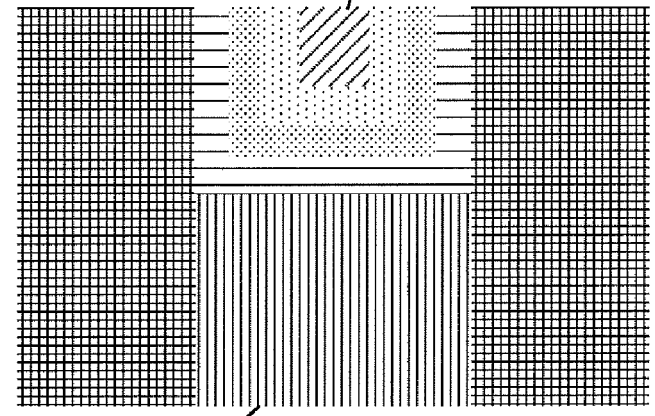

A recess 67 is formed in the substrate, shown in FIG. 6b, preferably by a preferential etch process, using a process selected to etch the plug at a higher rate than the substrate material. For the preferred structure shown, a suitable embodiment includes a W etching process.

The electrode 60 is completed employing the successive deposition steps, followed by CMP, as described above and shown in FIGS. 6c and 6d. Contact with other circuit elements is accomplished at the plug element 65 and the upper electrode 62.

Figure 6E:
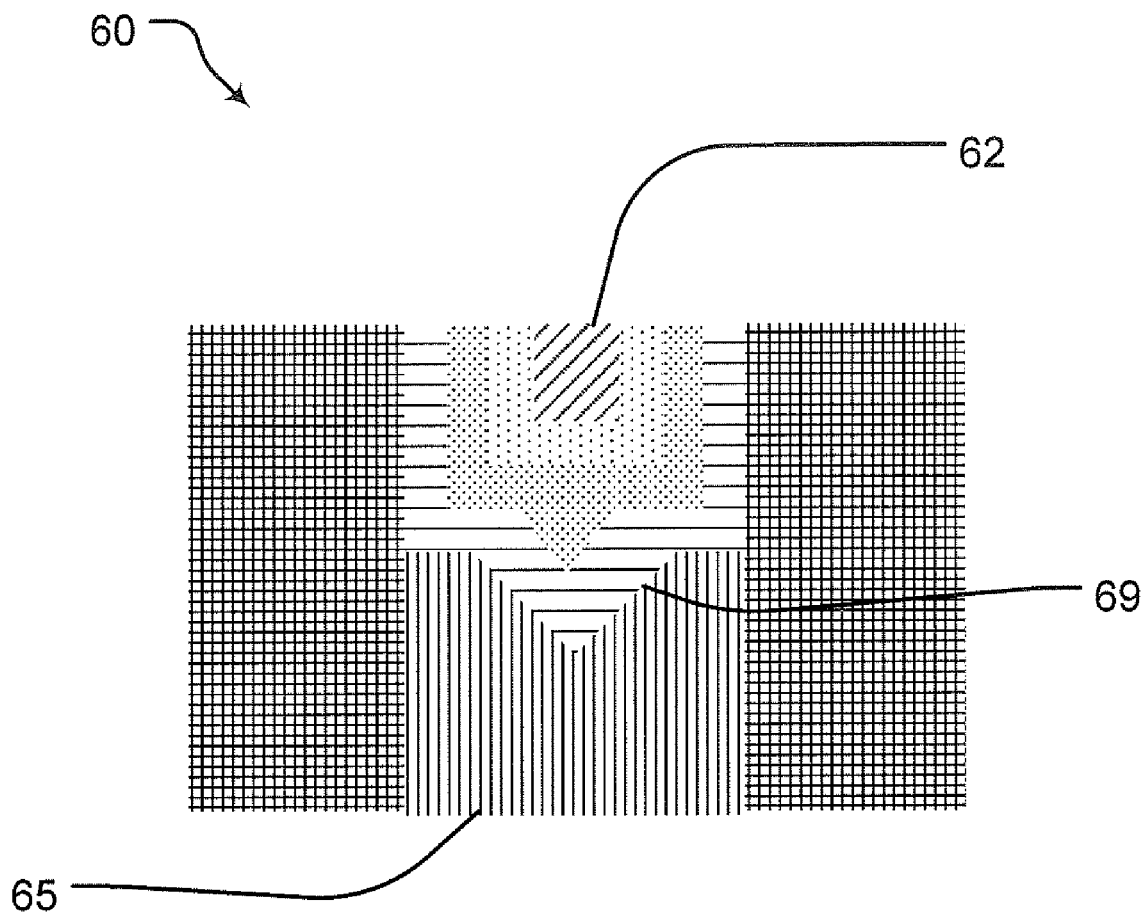

As is known in the art, deposition into a relatively high-aspect ratio opening, such as the plug element 65, can result in the formation of deep seams in the deposited material. Deposited material tends to cling conformally to the sides of a receptacle structure, leaving voids or seams instead of a uniformly solid material. A subsequent etching or CMP step can open the seam, but nevertheless a seam can remain in the deposited structure. Because of its high conformity, tungsten is particularly susceptible to that phenomenon, as can be seen in FIG. 6e, where seam 69 remains visible in the plug element even after etching to considerable depth. In such an instance, the subsequently-deposited material may not make full contact with the earlier-formed material, resulting in poor inter-layer contact.

The present invention alleviates problems associated with that phenomenon because the electrode material and associated structure are active in filling gaps such as seam 69. This material assures good, continuous contact between the electrode material and the W of the plug 65.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory cell, comprising an electrode structure comprising:
   a memory element comprising a phase change material;
   a plurality of electrode layers, arranged in a stack having a thickness and having a distal layer and a side, the distal layer comprising a barrier material with an electrical resistivity, having an outer surface contact contacting the phase change material, said plurality of electrode layers being characterized by having a lower thermal conductivity than a single layer of the barrier material having the said stack thickness; and
   a sidewall conductor layer arranged to abut the side of the electrode layer stack, the sidewall conductor layer is a material different than the barrier material, and having an end level with the outer surface of the distal layer of the stack;
   wherein the phase change material of the memory element is not in contact with the sidewall conductor layer.

2. The memory cell of claim 1, wherein the electrode layers are formed of a material or materials chosen from the group including TiN, TaN and Ta.

3. The memory cell of claim 1, wherein the electrode layers are formed of materials including a doped semiconductor.

4. The memory cell of claim 1, wherein the plurality of electrode layers includes more than two electrode layers.

5. The memory cell of claim 1, wherein the sidewall conductor layer comprises Ti.

6. The memory cell of claim 1, wherein the electrode layers are thin films of about 0.3 nm to 20 nm in thickness.

7. The memory cell of claim 1, wherein the electrode layers are thin films of up to about 5 nm in thickness.

8. The memory cell of claim 1, wherein the sidewall conductor layer is a thin film of about 0.3 nm to 20 nm in thickness.

9. The memory cell of claim 1, wherein the sidewall conductor layer is a thin film of up to about 5 nm in thickness.

10. The memory cell of claim 1, wherein the barrier material comprises a metal nitride and the sidewall conductor layer is a material having a lower resistivity than the metal nitride.

11. A memory device, comprising:
    a memory element comprising a phase change material;
    a first conducting structure having a first stack of electrode layers and a first sidewall conductor, wherein the first stack of electrode layers has a thickness, a distal layer and a side, the distal layer comprising a barrier material with an electrical resistivity, and having an outer surface contacting the phase change material in an area of contact, and wherein the first sidewall conductor is a material different than the barrier material, and abuts a side of the first stack of electrode layers; and
    a second conducting structure having a second stack of electrode layers and a second sidewall conductor, wherein the second stack of electrode layers has a thickness, a distal layer and a side, the distal layer comprising a barrier material with an electrical resistivity, and having an outer surface contacting the phase change material in an area of contact substantially the same as the area of contact as that of the distal layer of the first stack of electrode layers, and wherein the second sidewall conductor is a material different than the barrier material, and abuts a side of the second stack of electrode and wherein the phase change material of the memory element is not in contact with the first sidewall conductor and is not in contact with the second sidewall conductor.

12. The memory device of claim 11 wherein at least one electrode layer in at least one of said first and second conducting structures comprises one or more materials chosen from the group including TiN, TaN and Ta and combinations thereof.

13. The memory device of claim 11 wherein at least one electrode layer in at least one of said first and second conducting structures comprises a doped semiconductor.

14. The memory device of claim 11 wherein the stack of electrode layers in at least one of said first and second conducting structures comprises more than two electrode layers.

15. The memory device of claim 11 wherein the sidewall conductor in at least one of said first and second conducting structures comprises Ti.

16. The memory device of claim 11 wherein at least one electrode layer in at least one of said first and second conducting structures is a thin film having a thickness in a range about 0.3 nm to about 20 nm.

17. The memory device of claim 11 wherein at least one electrode layer in at least one of said first and second conducting structures is a thin film having a thickness up to about 5 nm.

18. The memory device of claim 11 wherein the sidewall conductor in at least one of said first and second conducting structures is a thin film having a thickness in a range about 0.3 nm to about 20 nm.

19. The memory device of claim 11 wherein the sidewall conductor in at least one of said first and second conducting structures is a thin film having a thickness up to about 5 nm.

20. The memory device of claim 11 wherein the first and second conducting structures provide electrical contact with the phase change material.

21. The memory device of claim 11, wherein the barrier material comprises a metal nitride and the first sidewall conductor and the second sidewall conductor are a material having a lower resistivity than the metal nitride.

* * * * *